(12) United States Patent
Hochschulz et al.

(10) Patent No.: US 9,024,401 B2
(45) Date of Patent: May 5, 2015

(54) PHOTODETECTOR, IMAGE SENSOR AND METHOD FOR MANUFACTURING

(75) Inventors: Frank Hochschulz, Duisburg (DE); Stefan Dreiner, Esssen (DE); Uwe Paschen, Dortmund (DE); Holger Vogt, Muehlheim (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 144 days.

(21) Appl. No.: 13/458,415

(22) Filed: Apr. 27, 2012

(65) Prior Publication Data

US 2012/0273910 A1    Nov. 1, 2012

(30) Foreign Application Priority Data

Apr. 29, 2011   (EP) ................................. 11003538
Jul. 28, 2011   (DE) ..................... 10 2011 079 990

(51) Int. Cl.
*H01L 31/0232*    (2014.01)
*H01L 27/146*    (2006.01)

(52) U.S. Cl.
CPC .... *H01L 27/14629* (2013.01); *H01L 31/02327* (2013.01)

(58) Field of Classification Search
CPC ................. H01L 31/02327; H01L 27/14629
See application file for complete search history.

(56) References Cited

U.S. PATENT DOCUMENTS

| 4,336,545 A | * | 6/1982 | Howe et al. ................. 346/135.1 |
| 5,703,355 A |   | 12/1997 | Kawamoto |
| 5,703,357 A | * | 12/1997 | Shih et al. ..................... 250/226 |
| 2009/0261353 A1 | | 10/2009 | Gaebler et al. |

FOREIGN PATENT DOCUMENTS

| DE | 10 2010 010 016 | 9/2011 |
| WO | WO 2007/042521 | 4/2007 |

OTHER PUBLICATIONS

Furumiya, et al., High-Sensitivity and No-Crosstalk Pixel Technology for Embedded CMOS Image Sensor, IEEE Transactions on Electron Devices, vol. 48, No. 10, Oct. 2001.
Vaillant, et al., High Performance UV Anti-Reflection Coating for Backthinned CCD and CMOS Image Sensors, International Conference on Space Optics, Oct. 4-8, 2010.

* cited by examiner

*Primary Examiner* — Hrayr A Sayadian
(74) *Attorney, Agent, or Firm* — Michael A. Glenn; Perkins Coie LLP

(57) ABSTRACT

The finding that with a reasonable effort a layer thickness and/or refractive index variation may be acquired which realizes different internal optical path lengths for impinging radiation whereby fluctuation of spectral sensitivity of the photodetector is reduced is used to provide image sensors with a less fluctuating spectral sensitivity with respect to different wavelengths, or photodetectors with a small fluctuation of the spectral sensitivity from photodetector to photodetector with respect to defined wavelengths, with a reasonable effort.

12 Claims, 11 Drawing Sheets

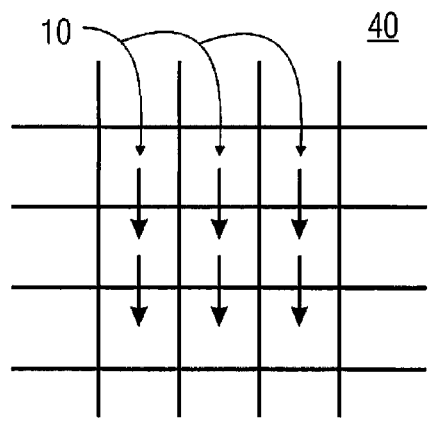
FIGURE 9
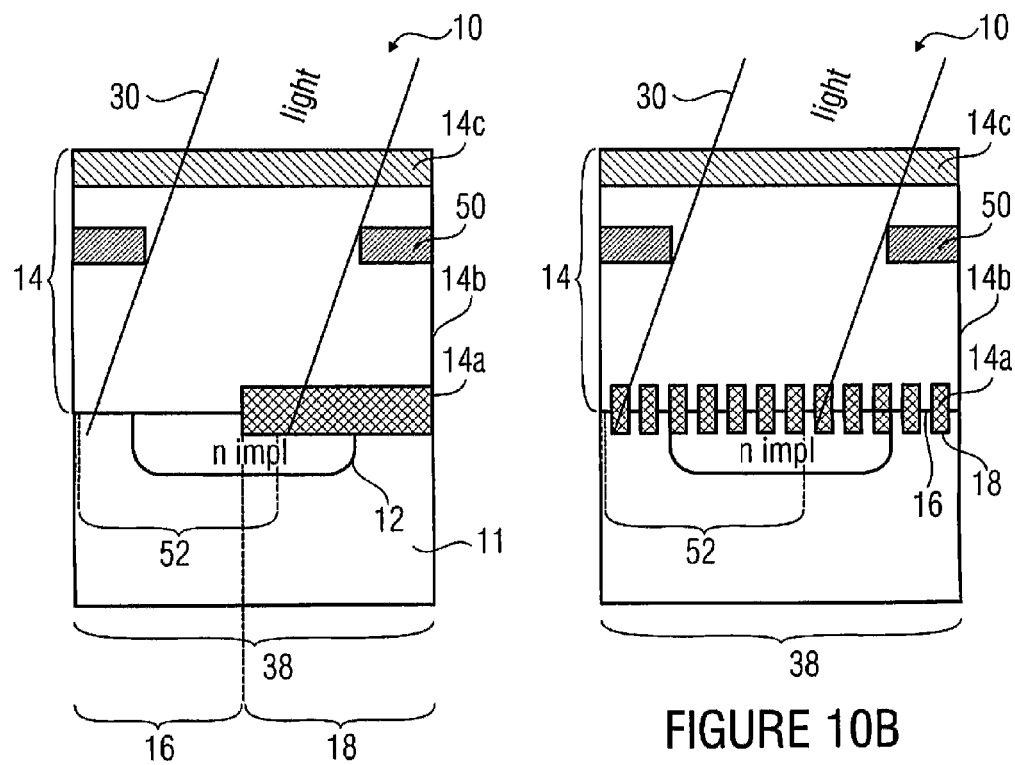
FIGURE 10A
FIGURE 10B

PHOTODETECTOR, IMAGE SENSOR AND METHOD FOR MANUFACTURING

CROSS-REFERENCE TO RELATED APPLICATIONS

This application claims priority from European Patent Application No. 11003538.3 filed Apr. 29, 2011 and German Patent Application No. 102011079990.7, which was filed on Jul. 28, 2011, and is incorporated herein in its entirety by reference.

BACKGROUND OF THE INVENTION

The present invention relates to a photodetector, like for example a photodiode, an image sensor having a plurality of photodetectors and corresponding methods for manufacturing.

In the past years, CMOS image sensors have acquired a large share of the market for general photo sensor technology applications. If, however, standard CMOS image sensors are used with applications which need the detection of light with a very small spectral bandwidth or (as a boundary case) the detection of monochromatic light (as it is conventional with applications of 3D runtime image generation or with many applications with laser light irradiation), specific effects become important which are negligible with standard photo sensor technology applications with a broad spectrum illumination.

A specific effect which may be observed is that for a given light wavelength to be detected strong fluctuation of sensitivity of the photodiode exists (wherein several of the same form an array). This observed fluctuation of sensitivity depends on small process-related fluctuations of the dielectric stack on the photodiodes and leads to great wafer-to-wafer and chip-to-chip fluctuations of spectral sensitivity. In a similar way, this also relates to different photodiodes on one single chip and thus influences the pixel response non-uniformity.

If, for example, conventional CMOS image sensors or CMOS photodiodes with narrow-band light are irradiated effects occur which are negligible with normal applications. Among others, with a narrow-band illumination an oscillation of the spectral sensitivity with a strong dependency on small variations of the wavelength and on small variations of the layer thicknesses of the individual dielectric layers occurs which are deposited onto the silicon in CMOS processes and insulate metal traces from each other. The interference of partial beams of the individual material interfaces leads to oscillations of sensitivity as the irradiation power which reaches into the silicon is modulated (see FIG. 1). The entirety of these layers is also referred to as an optical stack, is typically about 5 μm thick and conventionally consists of silicon oxide or silicon nitride and possibly further layers like color filters.

With broadband applications, in the spectrum of the incident light wavelengths are contained which are in different ranges of oscillation, so that an averaging takes place and no problems exist. With applications with a virtually monochromatic illumination (e.g. by a laser) the insecurities of spectral sensitivity by process-related layer thickness fluctuations have to be considered, however. If, as a concrete example, monochromatic light with a wavelength of approximately 750 nm is used as a basis and a layer stack of 4.4 to 6.4 μm silicon oxide and 650 to 850 nm silicon nitride (these are realistic layer thickness fluctuations), then this is accompanied by a quantum efficiency between 0.37 and 0.81 (see FIG. 4a). The difference of maximum and minimum quantum efficiency in this case is 0.43. For many applications like, e.g. the 3D time of flight imaging, triangulation sensors and spectroscopy, these insecurities of spectral sensitivity are not tolerable, as they have an effect on insecurities of the measurement value.

One possible solution to the problem is a calibration. In this step, after manufacturing each image sensor is illuminated with a known illumination or irradiation strength and the resulting current is determined. From this recalculation, the sensitivity of each individual photodiode may be determined, which is subsequently either directly stored in the image sensor or in the camera system as calibration data or has to be considered in data processing later on.

Another theoretical way may be anti-reflex coatings (ARC). Here, a difference has to be made between three different ARC terms. In connection with commercial CMOS image sensors, frequently an SiN layer of <100 nm is deposited on a very thin $SiO_2$ layer (approximately 10 nm) above the photoactive areas. As the refractive index of SiN is between that of Si and $SiO_2$, and the $SiO_2$ layer between SiN and Si is very small, the reflection is reduced. In general, an ARC is a multilayer sheet of different materials which suppress reflection by an advantageous utilization of interferences. For this method, the refractive indices of the used layers have to fulfill certain relations so that an optimum result is acquired. As a special case, this multilayer sheet may be manufactured from $SiO_2$ and SiN, which does not lead to optimum results, however, as the requirements to the refractive index may not be exactly fulfilled.

The first possibility has the advantage that it may do without new materials. SiN is well known and thus exists in many CMOS processes (see for example Furumiya, M.; Ohkubo, H.; Muramatsu, Y.; Kurosawa, S.; Okamoto, F.; Fujimoto, Y. & Nakashiba, Y High-sensitivity and no-crosstalk pixel technology for embedded CMOS image sensor Electron Devices, IEEE Transactions on, 2001, 48, 2221-2227). The integration of a correspondingly thick layer in photoactive areas is needed, however. Simulations in which different layer thickness combinations were examined do show a reduction of reflection and thus also of the process-dependent sensitivity fluctuations, but the reduction which may be acquired is substantially lower than desired.

If an ARC layer stack with materials is considered which are not normally used in CMOS processes, many new challenges result for example with regard to adherence, patternability stability and integrability into CMOS processes. A special challenge here is maintaining the layer thickness specifications to be able to stick to interference conditions. Scientific publications on this topic are rare (see Vaillant, J.; Grand, G.; Lee, Y.; Raby, J.; Cazaux, Y; Henrion, Y. & Hibon, V. (Eds.) High Performance UV Anti-Reflection Coating for Backthinned CCD and CMOS Image Sensors, ICSO 2010). A further disadvantage of both methods is that the requirements to fluctuations of the layer thickness are substantially higher than with this invention.

SUMMARY

According to an embodiment, a photodetector for detecting impinging radiation may have a layer thickness and/or refractive index variation realizing different internal optical path lengths for the impinging radiation, whereby a fluctuation of the spectral sensitivity of the photodetector is reduced.

According to another embodiment, an image sensor may have a plurality of photodetectors for detecting impinging radiation which may have a layer thickness and/or refractive index variation realizing different internal optical path lengths for the impinging radiation, whereby a fluctuation of the spectral sensitivity of the photodetector is reduced.

According to another embodiment, a method for manufacturing a photodetector with a layer thickness and/or refractive index variation may have the step of generating a layer of the photodetector with a layer thickness and/or refractive index variation realizing different internal optical path lengths for the impinging radiation, whereby a fluctuation of the spectral sensitivity of the photodetector is reduced.

A central idea of the present invention is to have found that it is possible to acquire a layer thickness and/or refractive index variation with a reasonable effort which realize different internal optical path lengths for the impinging radiation whereby the fluctuation or oscillation of the spectral sensitivity of the photodetector is reduced and by this again the creation of image sensors with a less fluctuating spectral sensitivity with respect to different wavelengths or the creation of photodetectors with a reduced fluctuation of spectral sensitivity from photodetector to photodetector with respect to defined wavelengths is enabled with a reasonable effort.

An inventive photodetector for detecting impinging radiation thus includes a layer thickness and/or refractive index variation which realizes different optical path lengths for the impinging irradiation within the photodetector, whereby a fluctuation of the spectral sensitivity of the photodetector is reduced.

According to embodiments, the photodetector comprises a photo sensitive element which is covered by one or several dielectric layers in which the layer thickness and/or refractive index variation is present which realizes the several different path lengths for impinging radiation within the photodetector, whereby the fluctuation of the spectral sensitivity of the photodetector is reduced depending on the wavelength and fluctuations of the layer thicknesses of the dielectric layers.

In some embodiments, the different thicknesses are generated by a local oxidation of the substrate of the optical stack.

BRIEF DESCRIPTION OF THE DRAWINGS

In the following, embodiments of the present invention are explained in more detail with reference to the accompanying drawings, in which:

FIG. 9 is a schematic top view onto an image sensor according to one embodiment;

FIG. 10a, b is a schematic sectional illustration of a photodetector according to embodiments, wherein a granularity into the areas of different layer thicknesses is selected differently.

DETAILED DESCRIPTION OF THE INVENTION

In the following, with reference to embodiments, concepts are disclosed which reduce the above mentioned sensitivity fluctuations of photodetectors, like for example CMOS photodiodes, which occur in particular when (virtually) monochromatic radiation (in the following referred to as "light") is detected. Frequently, here the concepts are described exemplarily using a CMOS photodiode, although the same concepts are of course advantageous in connection with other manufacturing methods, i.e. in general in connection with other photodetectors and also with other detector technologies as such.

Embodiments described in the following provide to introduce several optical wavelengths of the dielectric stack into each photodiode. Using this concept, the maximum quantum efficiency fluctuation may be substantially reduced for process-related thickness fluctuations for a wide range of wavelengths.

If, as it is the case according to some embodiments described in the following, an LOCOS technology is used for forming a thermal oxide layer on the substrate containing p/n transitions for generating photodiodes, no additional processing steps are needed.

A consideration which leads to embodiments described in the following or illustrates the advantages may be as follows.

When standard CMOS photodiodes are illuminated by monochromatic light (or light with a very small spectral bandwidth), substantial dependencies of the spectral sensitivity on the detected light wavelength—in the following referred to as oscillations—becomes dominant. These oscillations result from the interference of partial waves reflected by material boundaries or interfaces in the optical stack which covers the silicon in CMOS processes (typical thickness for example 5 µm).

With conventional image generation applications with a great spectral bandwidth of the light to be detected, these oscillations are not visible in the response of the sensor, as different parts of the oscillation contribute to the response and a reduction of the oscillation occurs.

Figure 1:
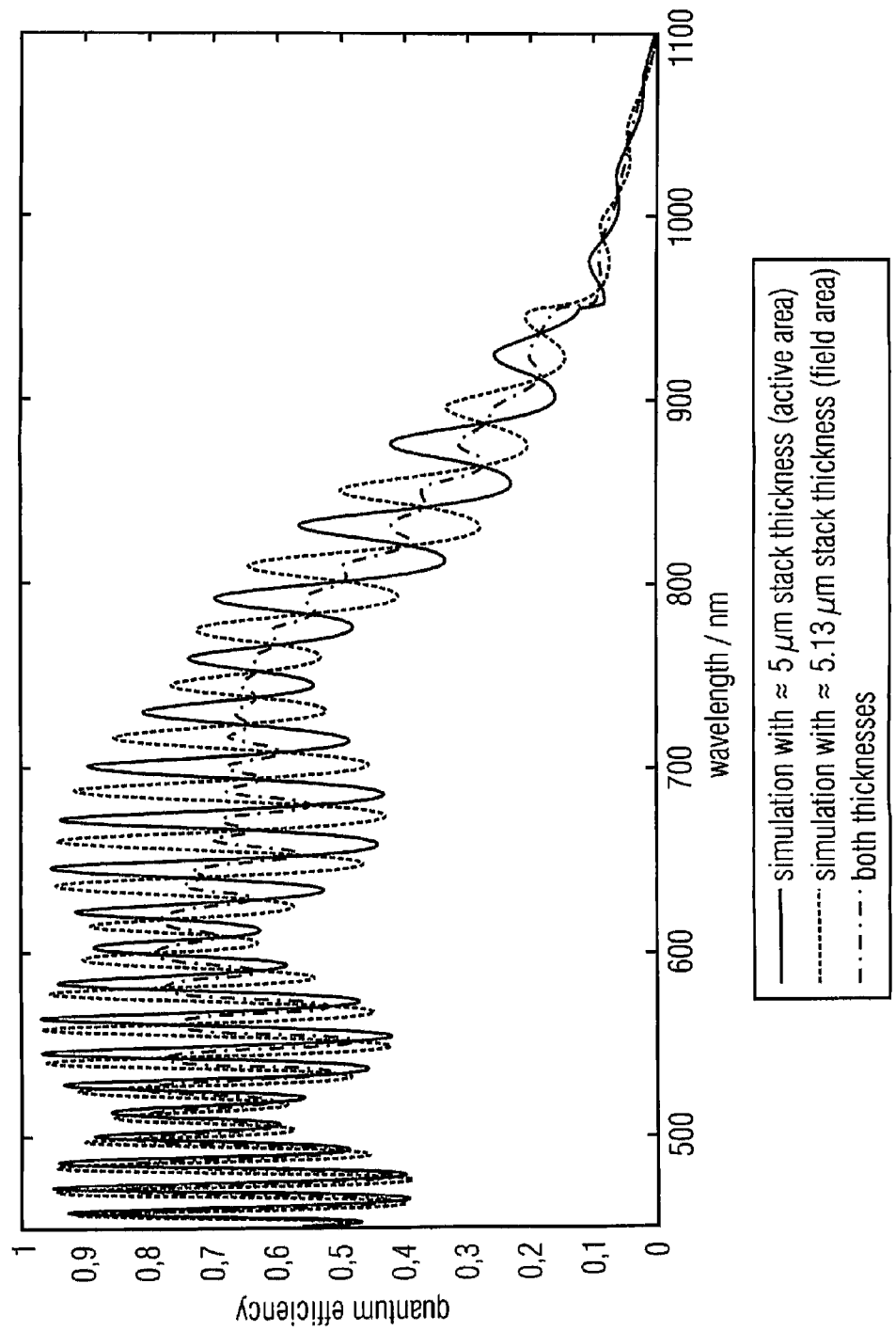
FIG. 1 is a simulation of the quantum efficiency of CMOS photodiodes depending on the wavelength with a monochromatic illumination for two different thicknesses of the dielectric stack of the photodiode and for overlaying these two layer thicknesses.

Different thicknesses of the optical stack extend the oscillations. In FIG. 1 such oscillations are plotted for two thicknesses of a dielectric stack with a thickness difference of 130 nm. FIG. 1 illustrates that the amplitudes of the fluctuations of the quantum efficiency are enormous as a function of the wavelength. The same applies to quantum efficiency with a fixed wavelength and a fluctuation of the layer thickness of the dielectric layers.

In other words, the spectral sensitivity fluctuates due to interference effects of partial beams which are reflected at the difference material boundaries or interfaces. Depending on the phase difference of the partial beams here a constructive (phase difference 0) or destructive interference (phase difference $\pi$) results and thus either a reduction or an increase of light power which enters the substrate. This phase difference depends on the wavelength and the optical path length. The interference effects are periodically dependent on the phase difference with a period of $2\pi$. If wavelength and/or optical path length change by more than $2\pi$, also the interference effects become visible as an oscillation of the spectral sensitivity.

Due to process fluctuations when processing the wafer which later carries CMOS image sensors and/or CMOS photodiodes, thickness fluctuations may occur on different wafers and also at different positions on one single wafer. For image sensors having a large recording range, a substantial thickness fluctuation may occur even within one single image sensor. Thus, for applications with a narrow radiation bandwidth or spectral width of radiation (e.g. spectroscopy, laser radiation like with 3D runtime applications) measures are needed to smooth the dependency of sensitivity on wavelength and/or small thickness fluctuations or variations of the dielectric stack on the photodiodes. If no such measures are undertaken, it is needed to calibrate a system with the individual sensitivity curve of each photodiode used in the system.

According to embodiments described in the following, two (or more) different thicknesses of the optical stack are implemented into each pixel. This may be acquired by different processing steps, for example a step of local oxidation of silicon (LOCOS) which thermally generates transparent non-conductive silicon oxide from silicon. This process consumes silicon and thus moves the silicon surface to the bottom in areas in which the process is not inhibited by masks. If later layers are treated by leveling processing steps like chemical-mechanical polishing (CMP), the upper boundary of the layers have the same level. As the LOCOS step has moved the silicon surface downwards in some areas, thus two different distances from the silicon surface to the upper boundary of the dielectric stack are introduced depending on whether the LOCOS process was masked. The resulting thickness change may also be generated by other processing steps, for example by etching a step into one of the layers which cover the silicon. In a similar way also a shallow trench isolation (STI) may be used.

The term optical stack here relates to the one or several layers above the substrate which contains the pn transition of the photodiode.

If the photodetector is located below two different thicknesses of the dielectric layers (forming the optical stack) which cover the silicon, the resulting sensitivity of the same is an overlaying of the sensitivity which corresponds to the individual thicknesses. If the thickness difference is thus controlled in a way so that the oscillations are exactly non-phase, process-related sensitivity fluctuations are minimized. For a target wavelength $\lambda$ and two thicknesses the resulting difference ought to be close to $\lambda/(4 \times n)$, wherein n is the refractive index of the layer comprising the thickness difference.

Thus, according to embodiments described in the following, the oscillations of the spectral sensitivity may be substantially reduced for a wide interval of wavelengths to be detected.

Measurements and simulations for first prototypes of photodiodes which consider the spectral bandwidth of the measurement system are executed to illustrate the principle. For these photodiodes the LOCOS processing step was used in order to introduce a thickness difference of approximately 130 nm.

The surface which due to the LOCOS process comprises a greater thickness of the thermal oxide is referred to as the field area, and the area comprising a smaller thickness of the thermal oxide is referred to as the active area. Photodiodes below active area, photodiodes below field area and photodiodes each with 50% of their surface below active area and 50% below field area were processed and characterized (see respective regions in FIG. 2).

Figure 2:
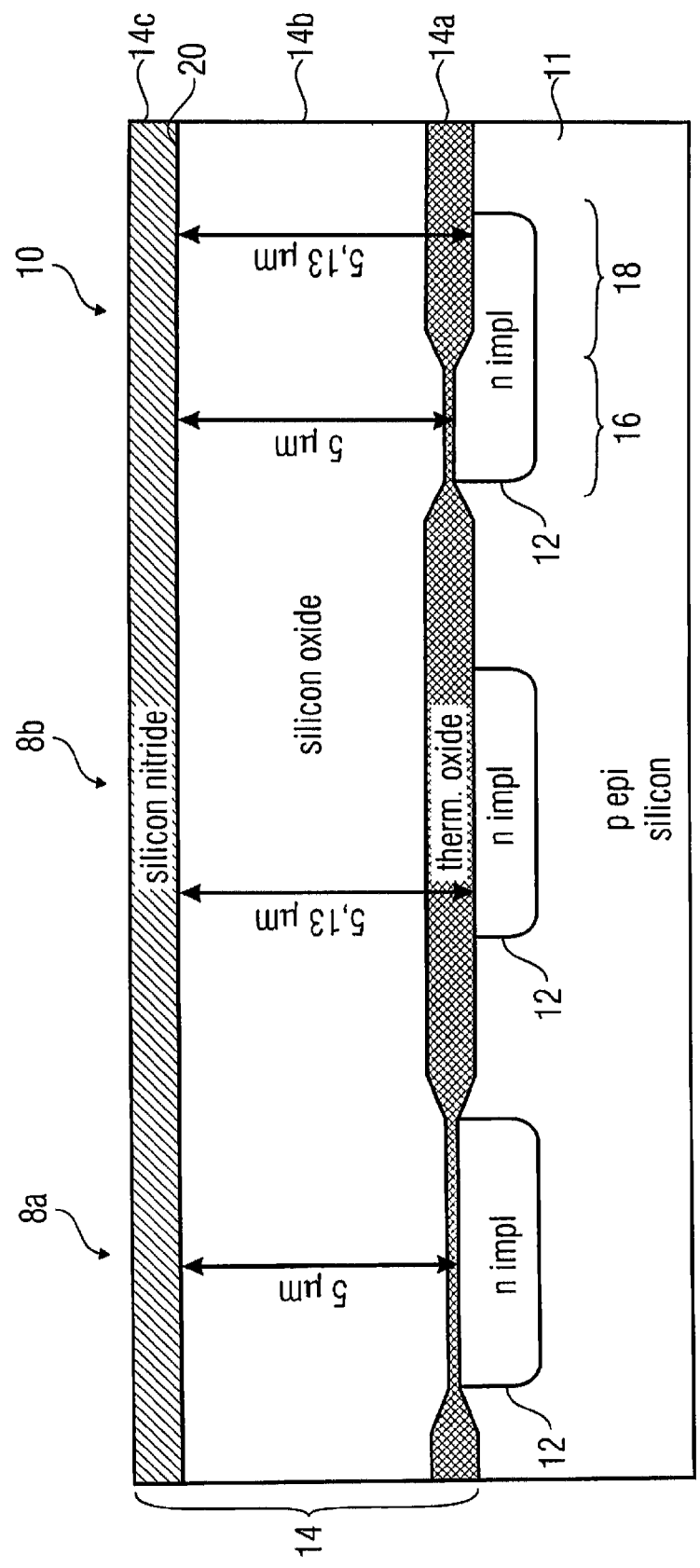
FIG. 2 is a schematic illustration of different photodiode structures in a cross section, i.e.
(left) a photodiode below the active area with approximately 5 µm stack thickness below the active area,
(center) a photodiode with approximately 5.13 µm stack thickness below the field area,
(right) a photodiode having both approximately 5 µm and also approximately 5.13 µm layer thickness or 50% below active area and 50% below field area.

A schematical cross section of the devices is illustrated in FIG. 2. In particular, FIG. 2 shows three photodetectors, i.e. two photodetectors 8a and 8b for comparison purposes to the left and in the center of the Figure and one photodetector 10 according to one embodiment of the present invention on the right side. All detectors 8a, 8b and 10 are exemplarily implemented as photodiodes each having one pn transition 12 in one substrate on which one optical stack 14 of dielectric layers 14a, 14b and 14c is located. Exemplarily, FIG. 2 shows that the substrate 11 on which the optical stack 14 is arranged each comprises an n doping area in the otherwise p doped substrate 11 on a side facing the optical stack 14 for forming the pn transition 12. The doping conditions may also be vice versa, however. Apart from that, pn transitions may also be generated otherwise. The substrate 11 does not necessarily, as illustrated in FIG. 2, have to be an epitactic substrate and a substrate of silicon, but other semiconductor materials would for example also be possible and the pn transitions 12 may be embedded in a trough with an inverse doping, wherein in this case the substrate 11 may for example be undoped or comprise a different basic doping.

Starting from the substrate 11, the stack 14 includes a layer 14a of thermal oxide 14a, followed by a deposited layer 14b of silicon oxide again followed by a layer of silicon nitride. As it will be discussed in the following, the embodiment for a photodetector 10 according to the present invention is merely an example in many respects. This also relates to the number of layers of the layer stack 14, to the materials, to the manufacturing of the thickness variation of the silicon oxide combination layer 14a plus 14b which will be explained in more detail in the following, from an LOCOS layer 14a and the further deposited oxide 14b etc. Anyway, with the photodetector 8a a mask was used in the application of the LOCOS process on the surface of the substrate 11 where the pn transitions 12 are formed, so that the LOCOS layer 14a of the detector 8a is thin and hardly anything or nothing of the semiconductor material or silicon of the substrate 11 was used up. With the detector 8b this was done exactly vice versa. Here, the LOCOS layer 14a is thick and the conversion of the silicon took place up to a deeper depth. The detector 10 according to one embodiment of the present invention comprises a zone 16 across the lateral area of the pn transition 12 in which the LOCOS layer 14a is thin or missing due to masking, and a zone 18 in which the layer thickness of the LOCOS layer is thick or thicker and the corresponding conversion depth is greater. By the application of the further silicon oxide 14b with a subsequent planarization on a side 20 facing away from the substrate 11, the photodetector 8a comprises a uniform layer thickness across its pn transition 12 which is smaller than a uniform layer thickness above the pn transition 12 of the photodetector 8b, and the pn transition 12 of the photodetector 10 again has two different thicknesses of silicon dioxide 14a-14b above the same, that is a lower thickness in zone 16 and a greater thickness in zone 18. The different thicknesses, as already indicated above and as it will be indicated in more detail in the following, bring advantages with respect to the reduction of oscillation of the spectral sensitivity with respect to the detectors 8a and 8b. The illustrated layer thickness indications in FIG. 2 are only to be regarded as an example.

Figure 4A:
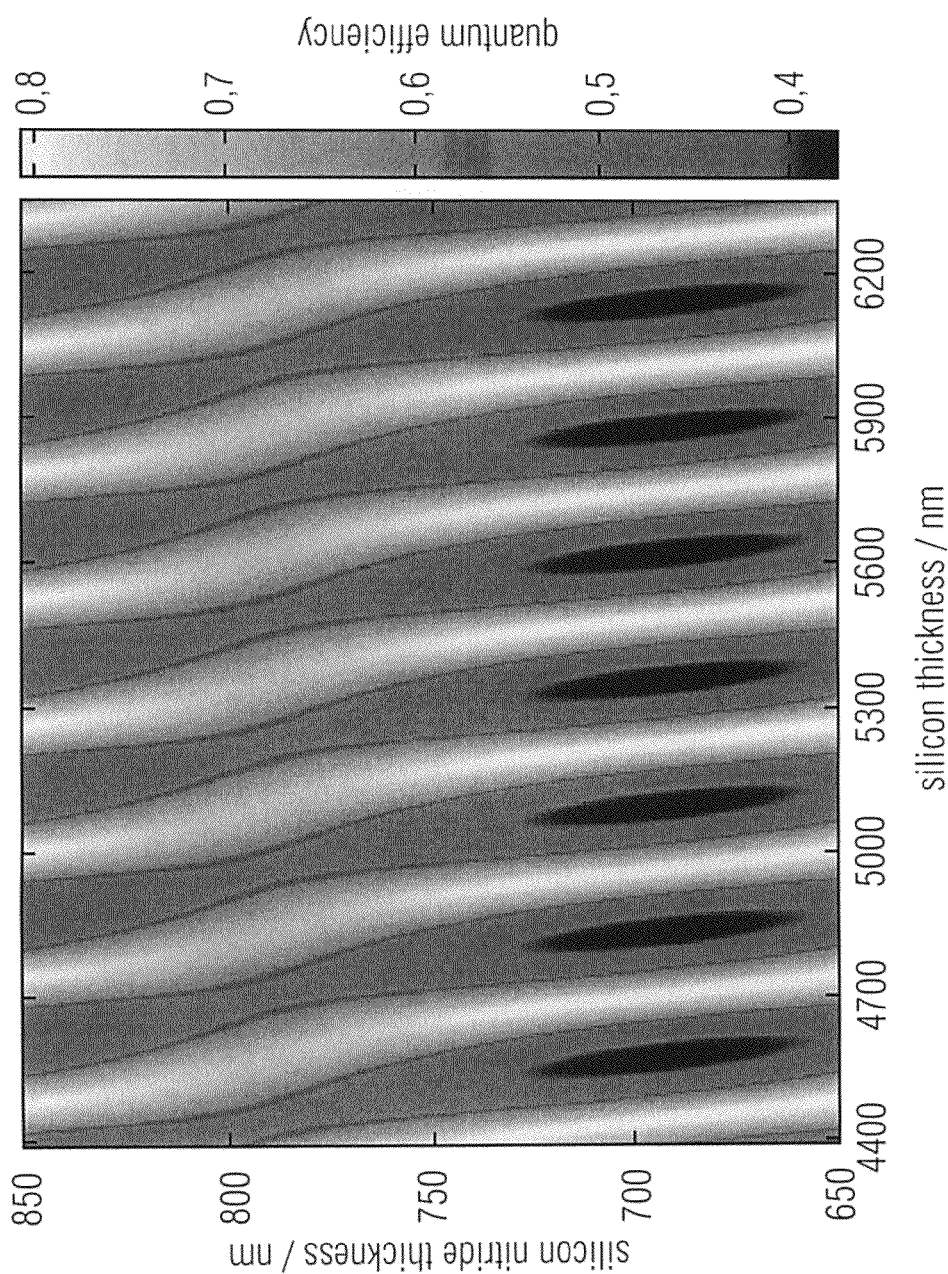
FIG. 4a is a gray-scale encoded illustration of the quantum efficiency with a wavelength of approximately 750 nm for a photodiode with one single stack thickness according to FIG. 2 left and center, but plotted for different thicknesses of the dielectric layers which cover the silicon.
Figure 4B:
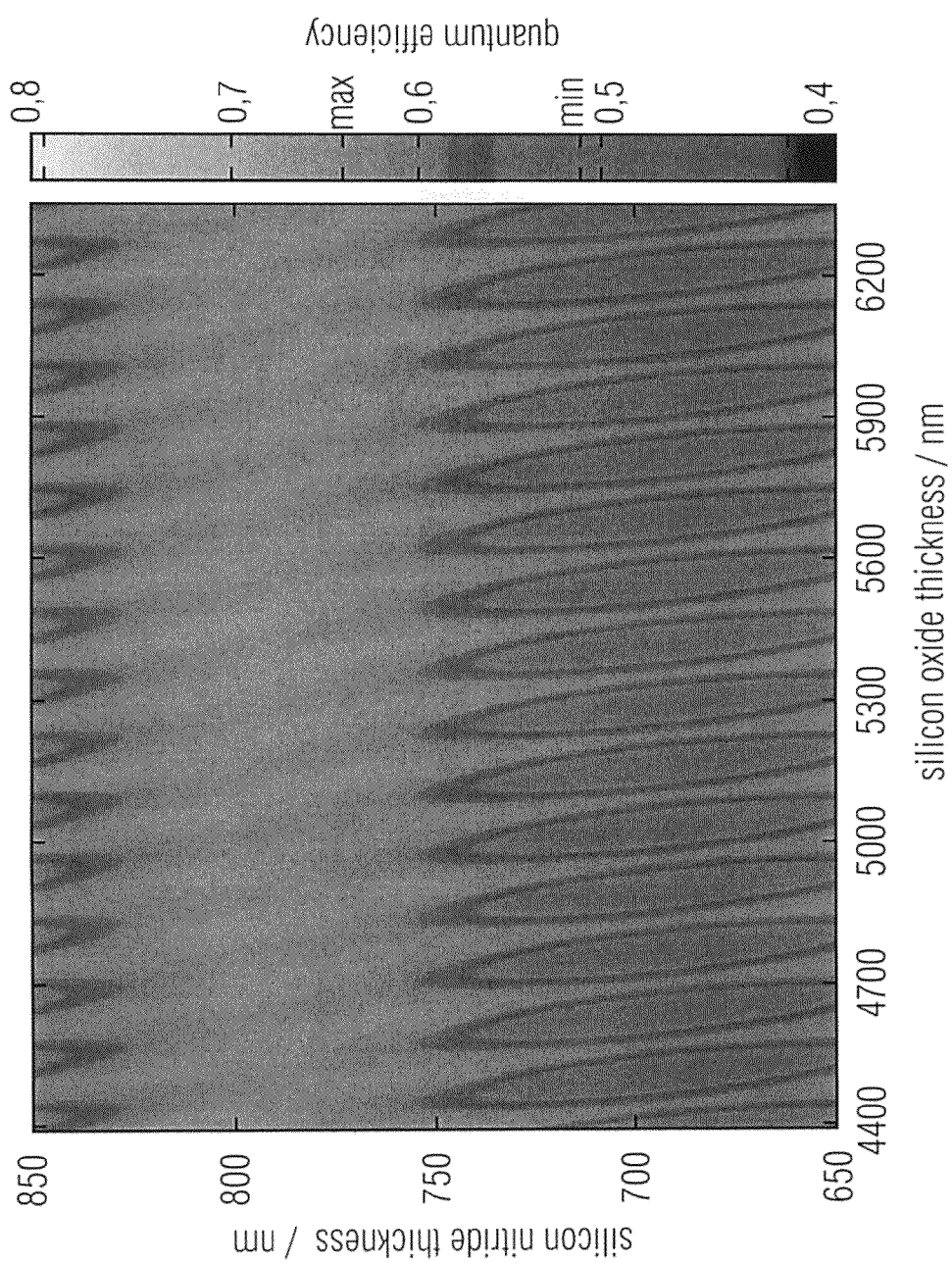
FIG. 4b as compared to FIG. 4a is a gray-scale encoded illustration of the quantum efficiency fluctuations with thickness fluctuations of the dielectric layers for a photodiode with an introduced layer thickness difference according to FIG. 2 right, wherein the fluctuations are visibly very much smaller for the photodiode with two introduced stack thicknesses according to FIG. 2 right.

As with the right-hand photodiode type 10 in FIG. 2 several optical path lengths determine the quantum efficiency, the dependency of process-related thickness fluctuations of the dielectric layers forming the optical stack consisting of silicon dioxide and silicon nitride and possibly of other materials (e.g. polyimide, spectral filters etc.) is drastically reduced in typical CMOS processes (see FIG. 4b as compared to FIG. 4a).

Using this method the process-related chip-to-chip fluctuations of the optical sensitivity of photodiodes for a specific narrowband illumination and the spectral sensitivity oscillations may be drastically reduced as a function of the wavelength without additional processing effort.

Before still further embodiments for photodetectors and image sensors and corresponding manufacturing methods are described in the following, first of all reference is to be made to some variation possibilities as compared to the presentation so far.

Figure 5:
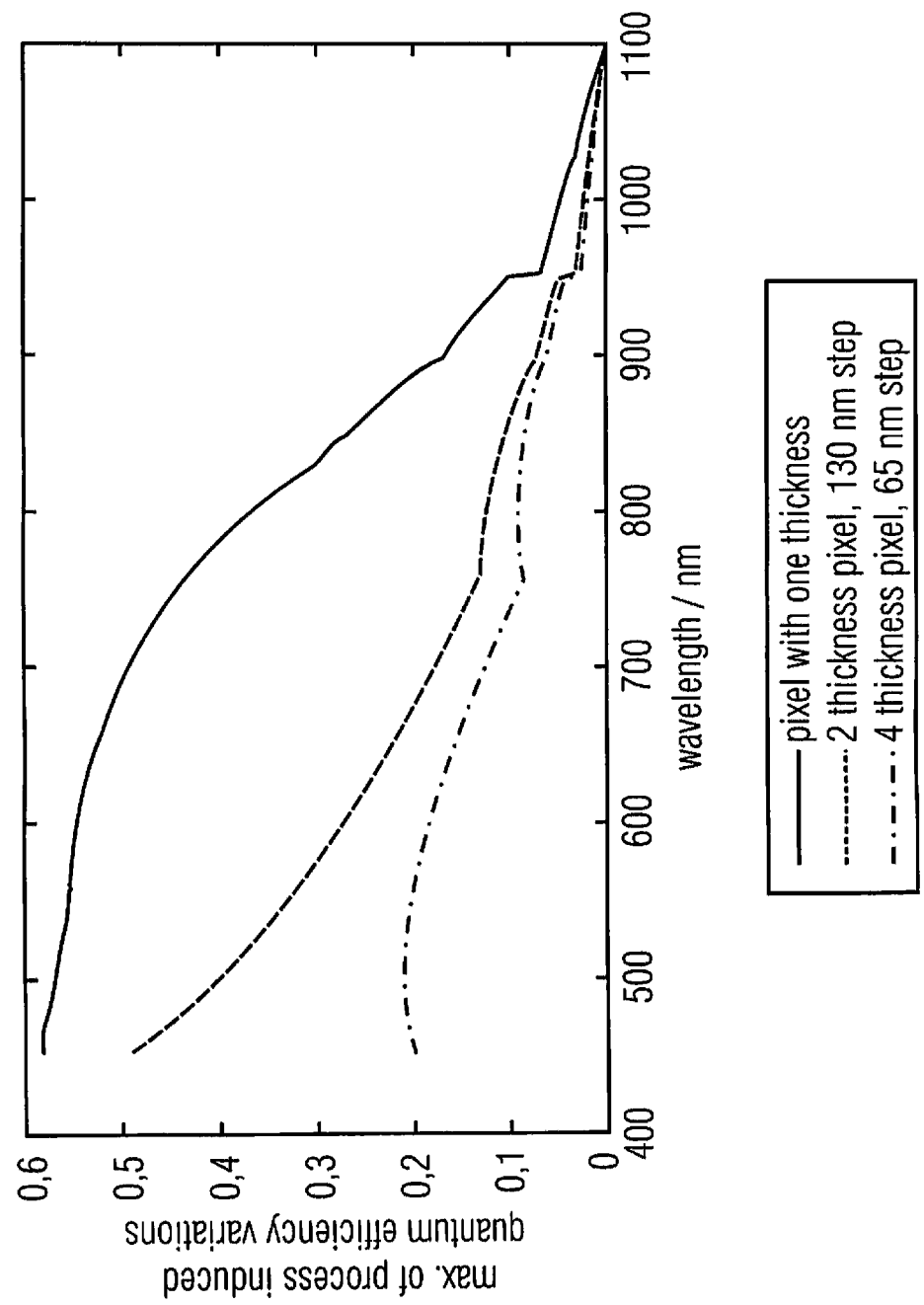
FIG. 5 is a graph in which the maximum process-based quantum efficiency fluctuation for different pixel structures is illustrated.

A fluctuation of the thickness of the optical stack as described above also reduces the sensitivity fluctuation due to process fluctuations for wavelengths close to $\lambda=4n^*s$ (see FIG. 5), wherein s is the thickness difference between the layers and n the refractive index. In particular, FIG. 5 shows that the process-related thickness fluctuations lead to a wavelength-dependent maximum difference of the quantum efficiency, wherein this maximum process-related quantum efficiency fluctuation is here illustrated for different pixel structures, i.e. (top line) with only one individual thickness, (middle line) with two thicknesses within one pixel, which differ by 130 nm, and (bottom line) for four thicknesses within one pixel which are each different by 65 nm. A pixel with two thicknesses suffers from less process-related fluctuations of the quantum efficiency than a pixel with an individual thickness, even for a wide wavelength region adjacent to $\lambda=4n^*n^*130$ nm. One pixel with four thicknesses even shows less process-related quantum efficiency fluctuations across a wider wavelength range.

Figure 3:
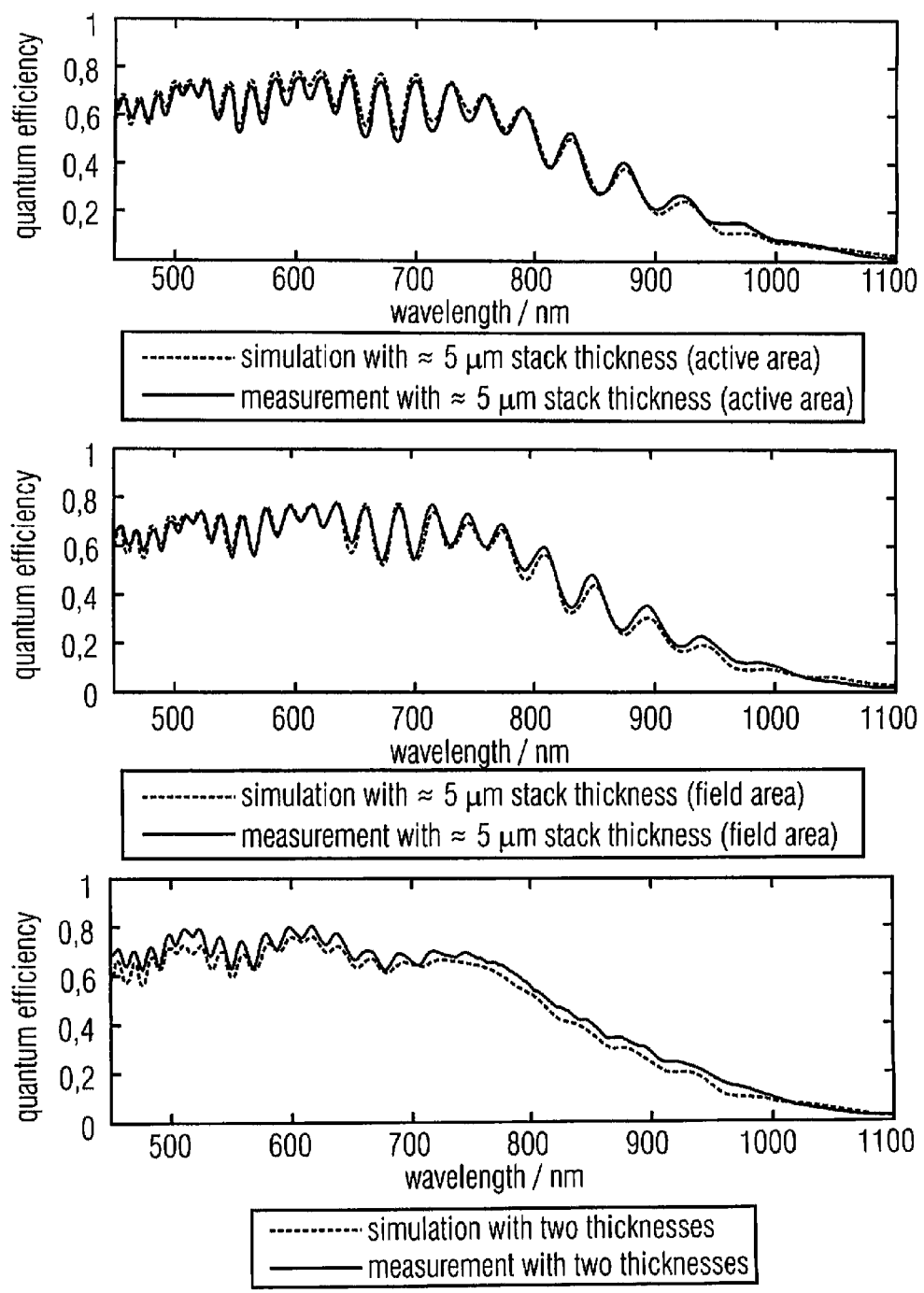
FIG. 3 is a graph for comparing measurements and simulations of the quantum efficiency of photodiodes according to FIG. 2, i.e.
(top) for photodiodes according to FIG. 2 left,
(center) field area for photodiodes according to FIG. 2 center,
(bottom) for photodiodes according to FIG. 2 right, wherein the simulations illustrated here consider the spectral width of the measuring stand and the smoothing of spectral sensitivity according to the simulations is clearly visible.

FIG. 3 shows a comparison of simulation and measurements at prototype structures of the individual photodiodes of FIG. 2. The simulations in this case consider the spectral width of the measurement stand: top: photodiode below active area. Center: photodiode below field area (130 nm more $SiO_2$). Bottom: photodiode half field and half active area. A smoothing of the spectral sensitivity corresponding to the simulations is clearly obvious.

The different optical paths do not have to be generated by the LOCOS or STI processing step. The same may also be generated by etching a similar structure into one of the top layers, e.g. the silicon nitride passivation, or by any other processing steps which lead to a change of thickness.

The different optical paths do not have to be generated by physical thickness changes, they may also be set up by using fluctuations of the refractive index n. This may, for example, be generated by etching the silicon oxide in some areas and replacing the same with a material comprising a different refractive index.

Figure 6:
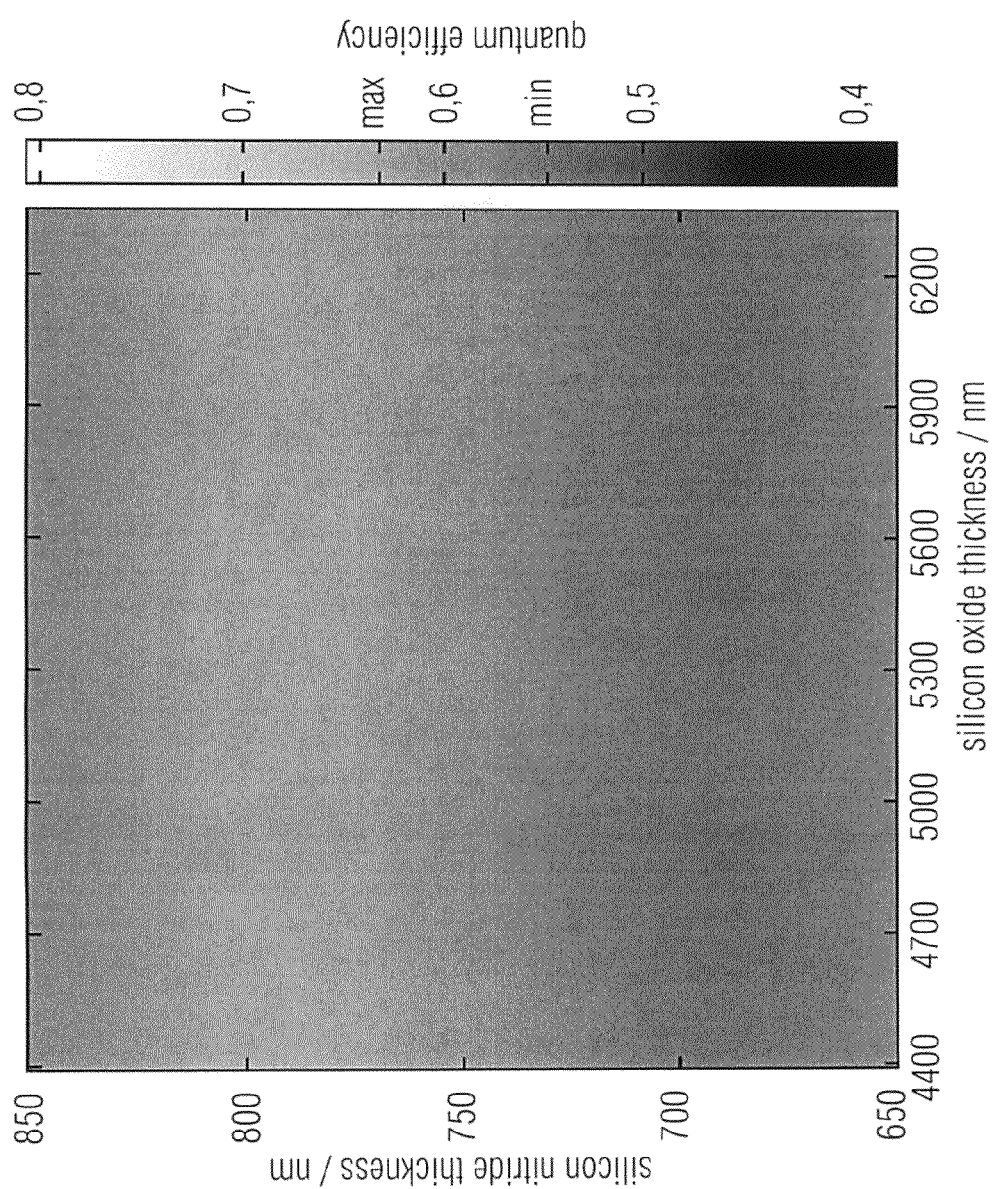
FIG. 6 is a gray-scale encoded illustration of the quantum efficiency with a wavelength of approximately 750 nm for a photodiode with four thicknesses with a difference of each 65 nm for different thicknesses of the dielectric layers which cover the silicon; the quantum efficiency fluctuations with thickness fluctuations of the dielectric layers are even smaller for this type of photodiode.

The number of stack thicknesses in one single pixel is not restricted to two. By receiving four layers of different thicknesses d, $d-\lambda/8$, $d-\lambda/4$ and $d-3^*\lambda/8$, the dependence of the sensitivity and process fluctuations may be reduced further. By using several steps, the wavelength interval which benefits from the process may be increased (see FIGS. 5 and 6).

This may be extended to a continuous fluctuation of the thickness from d to $d-\lambda/2$.

When the impinging radiation does not hit the photodiodes perpendicular to the surface, different parts of the two photodiode areas are illuminated. Thus, the lateral structure of the fluctuation of the optical path ought to be controlled in a way so that for each illumination angle similar parts of the different thicknesses are illuminated. For this purpose, checker board structures, radially changing (cake-shaped) or conical structures may be used.

Among the embodiments explained in more detail in the following, there are also ones where changes of the physical thickness of the layers in a photodetector are provided, like e.g. a CMOS photodiode, which may be an element of an image sensor or CMOS image sensor. The thickness of the layers may, for example, be detected using an SEM cross section. Among the embodiments explained in more detail in the following, there are also ones for which only the refractive index is changed. The latter are noticeable after manufacturing in more complex measuring instruments for measuring the optical characteristics of the used materials, like for example TOF-SIMS or RBS.

One basic idea of embodiments of the present invention thus is to introduce several optical path lengths in a photodetector, like e.g. a CMOS photodiode, which may again be an element of an array which forms an image sensor or CMOS image sensor.

Figure 7:
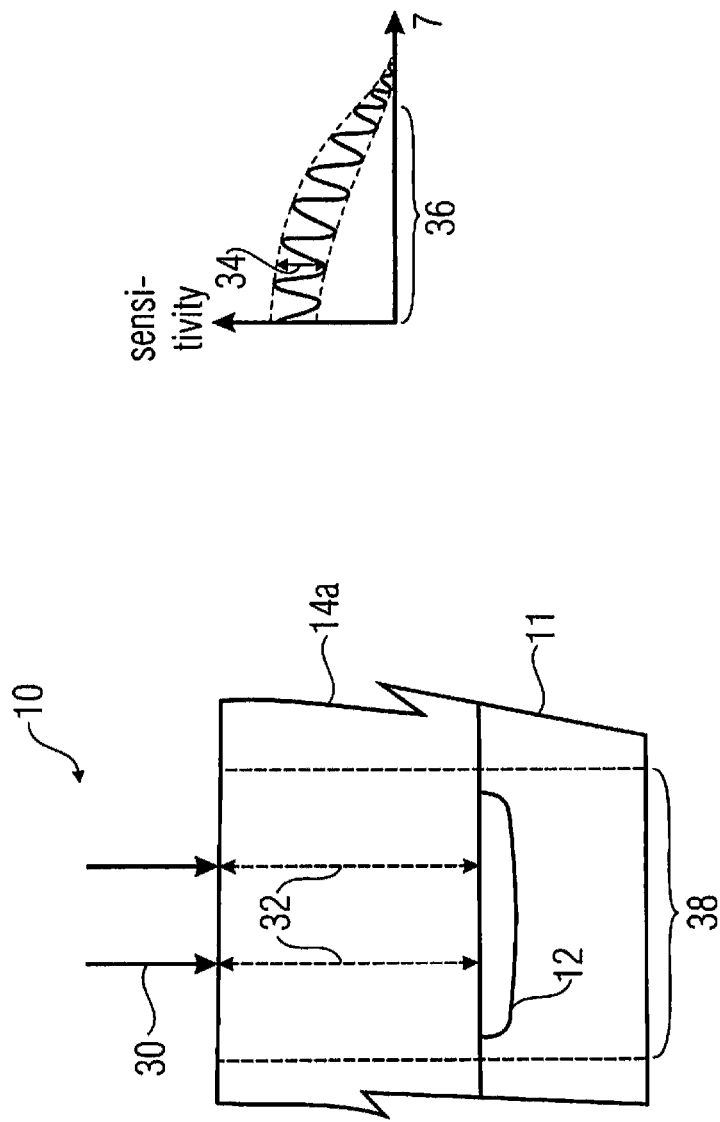
FIG. 7 is a schematic cross-sectional view of a photodetector according to one embodiment.

One embodiment of a photodetector for which the photodiode on the right in FIG. 2 so to speak represents one possible implementation is illustrated in FIG. 7. For improving understanding, reference numerals are used as they have been used for corresponding elements in FIG. 2. FIG. 7 shows a photodetector 10 for detecting impinging radiation 30 with a layer thickness and/or refractive index variation which realizes different internal optical path lengths 32 for the impinging radiation 30, whereby an oscillation 34 of the spectral sensitivity of the photodetector 10—measured for example as an average scattering width, like e.g. standard deviation, sensitivity in an operating wavelength range 36 of the detector 10, like e.g. visible and/or infrared and/or UV light, as illustrated in FIG. 7—is reduced.

Here, the photodetector 10 may be a photodiode with a pn transition 12 as a photosensitive element, wherein alternatives are also possible. The photodetector 10 may comprise a substrate 11 and an optical stack with at least one or at least one layer 14a above the substrate 11, so that the radiation 30 on the path to the photosensitive element 12 penetrates the layer 14a. The substrate 11 is for example a suitable semiconductor substrate.

The layer 14a and the possible further layers of the optical stack advantageously are dielectric layers. Advantageously, the same comprise or comprises an optical transparency in the area 36. The transmission degree of the layer 14 in this area 36 is for example continuously larger than 50%.

In substrate 11, a photosensitive element, like e.g. the pn transition 12, may be formed, like e.g., at the side facing the layer 14a.

For layer thickness variation, now the layer 14a may for example comprise several different thicknesses in the lateral area 38 penetrated by radiation 30 which contributes to photoconversion in the photosensitive element, i.e. e.g. within the lateral extent of diffusion plus drift zone of the pn transition 12. In particular, the photodetector may comprise the layer thickness variation in an LOCOS layer 14a. A layer applied to the LOCOS layer I4a, as it was exemplarily illustrated on the right in FIG. 2 by reference numeral 14b, may be planarized on side 20 facing away from the substrate 11. The material may be the same as the material of the LOCOS layer 14a, whereby a layer with a laterally varying layer thickness results, i.e. the combination of 14a and 14b. The layer thickness variation may be realized continuously or in steps in area 38. A range of the layer thickness variation is, for example, greater than 10 nm like e.g. with regard to the or within the interior of the area 38, and is for example between 10 nm and 400 nm, in order to cause the above explained reduction of oscillation 34 in an especially strong way in the wavelength range 36. Another area selection would be to select the range greater than 50 nm so that it is for example between 50 nm and 200 nm. In case of a single step in the nominal thickness profile of layer 14a or another binary step profile, like e.g. the checkerboard pattern, which is to be explained in the following, the range or span corresponds to the step height.

As indicated, the layer 14a may also be a layer with a lateral refractive index variation or with a layer thickness and refractive index variation, and here this variation may be implemented in range 38 at least so that a standard deviation of the same corresponds to an optical path length variation along a thickness direction of layer 14a for radiations in the wavelength range 36 of more than 10 nm and for example between 10 and 400 nm, and possibly even more than 50 nm and possibly between 50 and 200 nm. The selected ranges result in a maximum of the quantum efficiency fluctuation reduction effect in desired wavelength ranges 36 of for example visible, infrared and/or UV light, when for example a material of the layer 14a with a refractive index between 1.4 and 2.5 is assumed, wherein this refractive index range is not to be regarded as limiting, but alternatives exists in this respect.

Etching one or several steps or a slope into layer 14a of the photodetector 10 or into the substrate 11 of the photodetector 10 in area 36 or applying LOCOS onto the substrate 11 of the photodetector 10 so that the resulting LOCOS layer 14a comprises such a step or slope as indicated also in FIG. 2 may be used in order to acquire a layer thickness variation. A partial etching of the layer 14a or the substrate 12 of the photodetector 10 and replacing the etched part by a material with another refractive index than a layer material of the layer 14a, so that there is a transition between the material with the other refractive index and the layer material as in the area 38, may be used in order to acquire a refractive index variation.

It is obvious that the layer 14a does not have to be applied directly onto the substrate 11. It may also be separated from the substrate 11 by a further layer with which the layer 14a forms the optical stack. Apart from that, of course also several layers in the optical stack may be provided with different optical path lengths.

An image sensor may thus be formed from a plurality of such photodetectors, that is with the advantages which were described above. Such an image sensor 40 may result when several photodetectors are formed in the substrate 11 and the layer 14a according to the photodetector 10, as it is indicated in FIG. 9.

Above described embodiments thus in other words are based on introducing several optical path lengths 32 in for example the optical stack 14 or 14a of a pixel or individual sensor 10. The difference of the optical path lengths 32 may here be selected so that (lateral) parts of the pixel are in a maximum of the oscillation of the sensitivity, while the other parts are in a minimum (see 16 and 18 in FIG. 2). This strictly only works for a certain wavelength, but also across a wide wavelength range leads to a strong smoothing of the oscillations. This way, sensitivity is smoothed, wherein both fluctuations of the wavelength and also fluctuations of the layer thickness are balanced.

Several optical path lengths may in principle be realized with two different possibilities. Either, the actual layer thickness varies or the refractive index is changed in partial areas 16 or 18 of the pixel. A variation of the layer thickness of the dielectric layers in a partial area of the pixel is for example possible by the local oxidation of silicon (LOCOS), by shallow-trench-isolation (STI) processes or by etching, as it was described with reference to FIG. 2. A variation of the refractive index may for example be acquired by introducing a different material in partial areas of a pixel.

As an example, a photodiode having two different optical path lengths was presented in FIG. 2 which was generated by a LOCOS process. The advantage of this variant here is that no additional masks or process steps for generating the optical path length difference are needed. On the other hand, the path difference is given by the process. In this case, a difference is made between active areas and field areas which comprise a greater thermal oxidation and may, depending on the process, penetrate silicon by 10 nm and several 100 nm more than active areas. In this case, the target layer thickness difference d for which smoothing the sensitivity works best is given by $d=\lambda/(4*n)$, wherein $\lambda$ is the wavelength and n is the refractive index of the material in which the layer thickness difference may be found. Vice versa, from a layer thickness difference of the two areas of, for example, 130 nm a wavelength of approximately 750 nm results.

Figure 8:
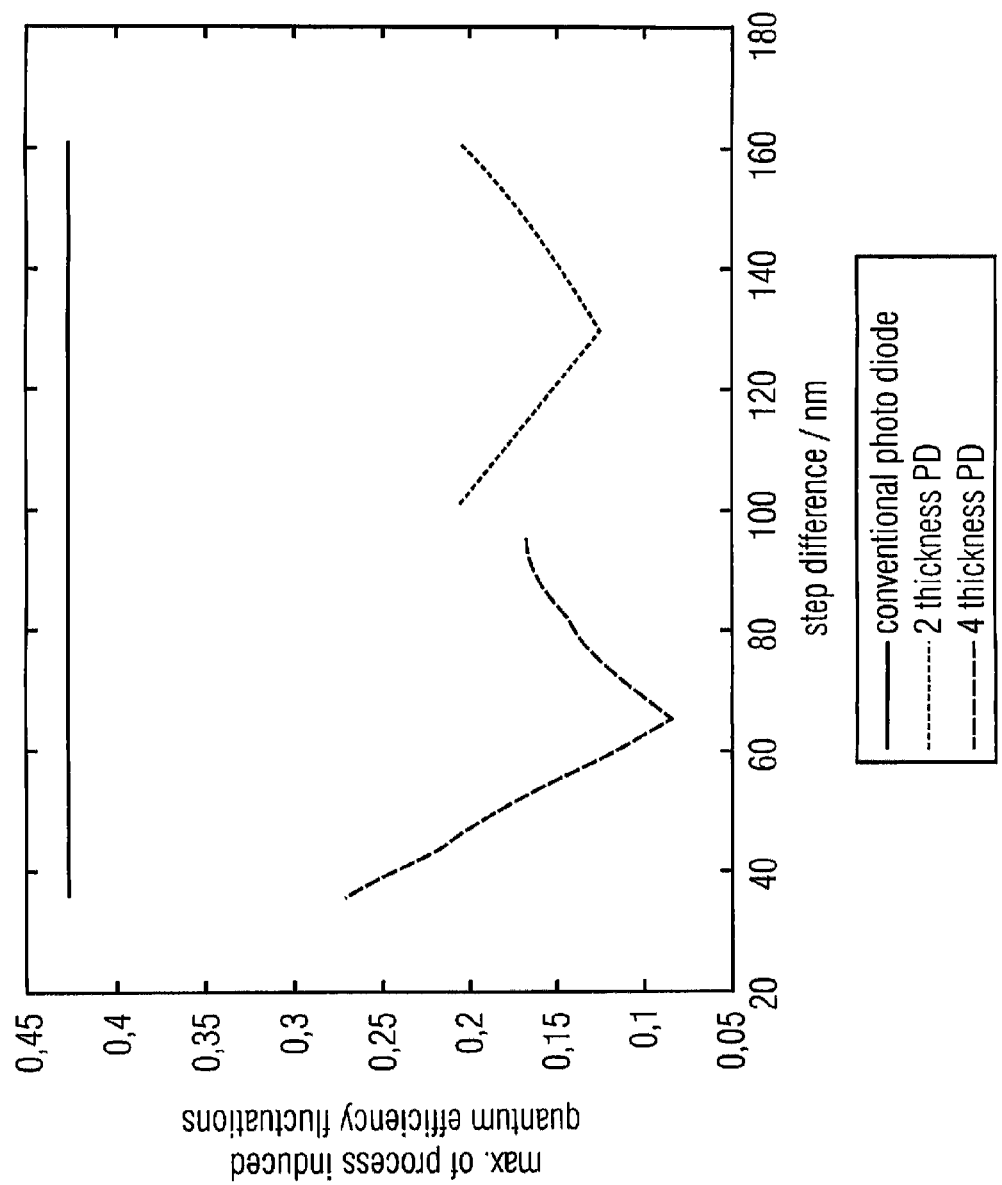
FIG. 8 is a graph in which the maximum variation of the quantum efficiency caused by layer thickness fluctuations is illustrated depending on the nominal layer thickness difference for different photodiodes, i.e. for conventional photodiodes with a uniform thickness, with two layer thickness photodiodes and four layer thickness photodiodes.

A schematical illustration of photodiodes completely below active or completely below field areas and a photodiode wherein a part lies below field and a part lies below active areas is illustrated in FIG. 2. A simulation of the sensitivity of photodiodes below active and field areas and an overlaying of the two areas is illustrated in FIG. 1. From this simulation it may be gathered that the overlaying leads to a smoothing of the spectral sensitivity in a wide wavelength range around the target wavelength of 750 nm. An exact examination of the maximum process-related sensitivity fluctuations depending on the wavelength is illustrated in FIG. 8. Measuring of prototype structures as compared to simulations is illustrated in FIG. 3. The measurements here confirm the smoothing of the spectral sensitivity across a wide wavelength range. In FIG. 4b, the dependence of the sensitivity on layer thickness fluctuations is simulated for a wavelength of 750 nm. These dependencies here sink from 0.43 for a conventional diode to 0.13 for a photodiode according to FIG. 2 right having two optical path lengths. In further simulations, the influence of variations of the layer thickness difference on the process-related sensitivity fluctuations was calculated. From these simulations, as mentioned above, it resulted that for a layer thickness difference of 130±10 nm the process-induced sensitivity fluctuations are between 0.15 and 0.13 (conventional photodiode 0.43). When processing the layer thickness difference no high requirements to layer thickness have to be set. As also already mentioned above, this process may be extended by additional optical path lengths. If four layer thicknesses with the thicknesses of d, d−λ/(8*n), d−λ/(4*n), and d−3*λ(8*n) are considered, again a reduced dependency of sensitivity on process fluctuations to 0.08 results (see FIG. 6). In gray levels, in FIG. 6 the simulated quantum efficiency of a photodiode is illustrated at approximately 750 nm in whose optical stack according to present embodiments four layer thicknesses are present comprising thicknesses of d, d−λ/(8*n), d−λ/(4*n), and d−3*λ/(8*n). In the borderline case also an extension to a continuous optical path length difference from d to d−λ/(2*n) would be possible. For such a continuous variation of the optical path length, however, a technical realization is difficult. FIG. 8 for example shows the maximum variations of the quantum efficiency caused by layer thickness manufacturing fluctuations depending on the layer thickness difference. A normal photodiode without a layer thickness difference has a constant value. For photodiodes according to FIG. 7 having two or four layer thicknesses or areas having two or four different layer thicknesses, different values result depending on the layer thickness difference.

With an inclined light incidence as it also exists with the exterior pixels of an image sensor, due to the limiting metal tracks in the optical stack a shadowing of pixel areas results. With a simple geometry in which two optical path lengths each are realized by one single large area, in this case a change of the irradiated parts of the two optical path lengths may result and thus a reduction of smoothing of the spectral sensitivity. By an advantageous arrangement of the individual path length areas, also with an inclined light incidence it may be guaranteed that the same parts of the optical path lengths are irradiated.

For example, this may be acquired by checkerboard patterns, radially alternating (cake-shaped) structures or concentric rings. In case of continuous layer thickness variations, in this respect conical structures may be used.

Figure 11A:
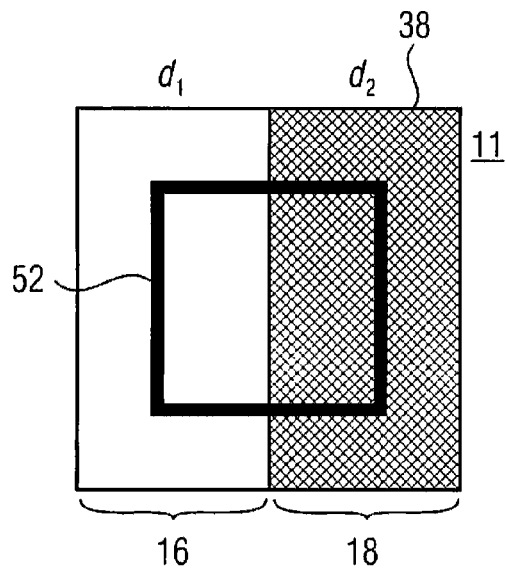
FIG. 11a-d are top views onto the photosensitive area with a perpendicular illumination (a, c) and angular incident light (b, d) for a photodiode according to FIG. 10a (a, b) and according to FIG. 10b (c, d).
Figure 11B:
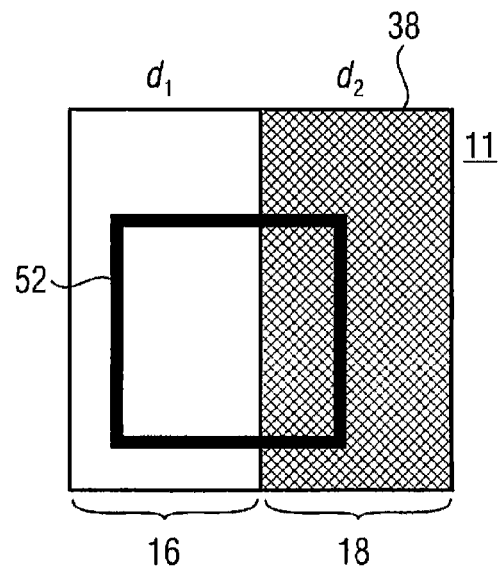
Figure 11C:
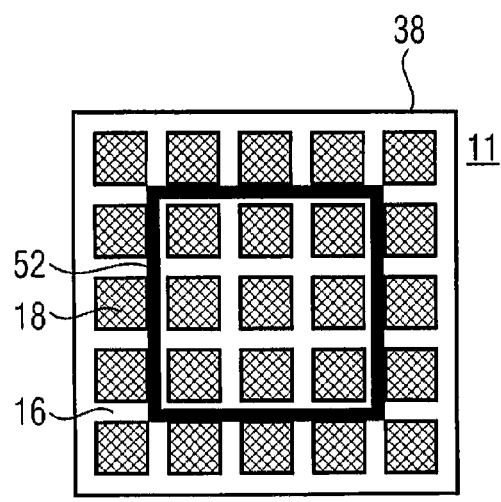
Figure 11D:
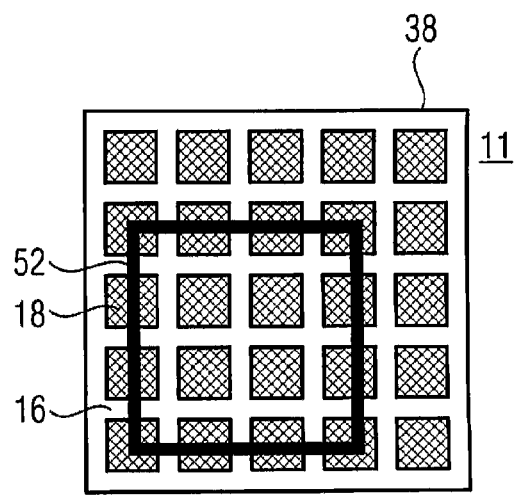

FIGS. 10a and 10b show photodetectors 10 according to embodiments with an angularly incident illumination, i.e. angularly incident irradiation 30. FIG. 10a shows a detector according to FIG. 2 right and FIG. 9b shows one which is modified in this respect. The illustrated angle of 32° is substantially larger than to be expected in reality (max. 15°). Apart from that, it is not illustrated to scale. The situation was chosen to better illustrate the problem of angularly incident light. If the two layer thicknesses of layer 14a or 14a and 14b are realized by one single large area as illustrated in FIG. 10a, for example due to shadowings of non-transparent structures 50, like e.g. of metal, with an inclined illumination an unequal portion of the two layer thickness areas 16 and 18 is actually illuminated, whereby averaging the sensitivities in this illuminated area 52 is reduced. If the layer thicknesses are realized by many small areas 16 or 18 (right) which for example alternate along two lateral axes more than five times with respect to each other, also with an angularly incident illumination a very similar portion of the two layer thicknesses is illuminated and averaging the sensitivity takes place virtually unhindered. The layer thickness areas 16 and 18 may for example be realized by a checkerboard pattern. FIGS. 11a-d show resulting top views onto the substrate surface for different geometries or patterns of the areas 16 and 18. FIG. 11a shows a top view onto a pixel or detector 10 with a simple division of the area 38 into partial areas of different overlaying optical path lengths 16 or 18 with a perpendicular illumination according to FIG. 10a and with an angularly incident illumination (right) as it is also illustrated in FIG. 10a. FIGS. 11a and 11b are representative for geometry divisions, wherein layer thickness areas 16 and 18 with the associated layer thicknesses $d_1$ and $d_2$ are each realized by a large single connected area. With the inclined or angular light incidence according to FIG. 11b, in this case a substantially larger area with a thickness $d_1$ is illuminated. If, as in FIG. 10b, the two layer thickness areas are realized by an interleaved arrangement of smaller areas, this leads to a more even illumination of the two layer thickness areas 16 and 18, but only with a perpendicular illumination as illustrated in FIG. 11c but also with an inclined illumination as illustrated in FIG. 11d.

Again with reference to FIG. 7, the implementations with respect to FIGS. 10a-11d indicate that it may be advantageous if not only the variation of the nominal thickness profile of layer 14a in thickness direction, i.e. the frequency distribution of the thicknesses is in the range 38 in the above-mentioned desired range, but when also the distribution of the areas with different thicknesses are interleaved with respect to each other or are present in a granularity whose grain size is smaller with respect to area than a quarter of the area of the photosensitive area or range 38 of the photodetector 10. In a discontinuous layer thickness profile with steps, the areas of a different thickness, as mentioned above, may be arranged in a checkerboard pattern or in a similar regular arrangement. The arrangement does not have to be regular, however, and areas with a different thickness do not have to be separate from each other or do not have to be restricted to only being allowed to connect with areas of the same thickness at corner points. Thus, for example, area 16 which has a small thickness and is in the form of a stripe grating may be one single multi-connected area, while the area 18 of high thickness of the dielectric layer 14a positioned thereon takes on disjunct areas in the intermediate stripe positions or gaps of the grating or vice versa, an option of which is illustrated in FIGS. 11a and 11b. In general, it is also advantageous when the nominal layer thickness profile of the layer 14a also fulfills certain conditions with respect to its spatial frequencies at least in the interior of area 38, i.e. the photosensitive area, like e.g. that a certain measure for the central tendency of the spectral spatial frequency (frequency) distribution corresponds to a period length which is smaller in two perpendicular lateral directions than for example the lateral extent of the photosensitive area 38 of even smaller or equal half of the same. Half the average period length virtually corresponds to a granularity grain size of a granularity of the thickness profile. As a measure for the central tendency for example the average value, the median or the mode may be used.

The determination of the above-mentioned measures for the central tendency of local spatial frequencies and the scattering of the thicknesses in the nominal thickness profile of layer 14a in the interior of the photosensitive area 38 may for example be determined as follows. For example, the nominal thickness profile of layer 14a is sampled equidistantly in a two-dimensional way in area 38 in order to obtain a two-dimensional field of thickness values. From these thickness values then, for example, the measure for scattering is determined, like e.g. the span or standard deviation. For local frequency evaluation the field may, for example, be subjected to a Fourier transformation or another suitable spatial frequency decomposition transformation in order to subject the resulting spectral values to a statistical evaluation for determining the central tendency, i.e. to determine where in the two-dimensional fields of local spatial frequencies, which correspond to the inverse of period lengths of the thickness profile, the central tendency of the spectral distribution is. The evaluation may, for example, be executed for two orthogonal local spatial or lateral directions separate from each other. In both directions, then for example the determined average period length ought to be smaller than the maximum extent of the photosensitive area 38 or even smaller than—or smaller or equal to—half of the maximum extent, like e.g. the lateral length or diameter of the area 38. As mentioned above, the nominal thickness profile of layer 14a may be continuous or discontinuous. In case, for example, that no shadowing structures 50 exist, or that the described shadowing effects do not disturb or are even desired, the requirements to the profile of the local spatial frequency distribution of the nominal thickness profile of the layer 14a may also be reduced or eliminated. Above statements accordingly also apply to fluctuations of the refractive index.

Again, to summarize in other words, one effect of the above indicated path length diversification is a smoothing of the spectral sensitivity with a narrow-band illumination of CMOS photodiodes with a low or even no additional processing effort. In more detail, the influence of variations of the wavelength and process-related layer thickness fluctuations onto spectral sensitivity is reduced. Such a homogenous sensitivity is advantageous for many applications, like 3D ToF imaging, spectroscopy or triangulation sensors, as the pixel response non-uniformity (PRNU) is reduced.

One advantage of above embodiments thus generally is an improvement of the homogeneity of sensitivity, which is advantageous for example with spectroscopic applications. On the other hand, with the improved homogeneity of the sensors it becomes possible in some cases for certain fields of application to use sensors which may do without a calibration. In this case, the sensors which are constructed according to the above embodiments may be offered at a far more favorable price. Applications which failed due to high costs of special image sensors may thus be made possible by above-described embodiments. One example for such an application are 3D-ToF sensors for detecting passengers in a car for example to control the release force of an airbag according to their position.

Alternative possibilities which provide similar advantages as the above embodiments, like e.g. calibration or sophisticated multi-layer anti-reflex layers are all connected with more effort and/or reduce the process-related sensitivity fluctuations not as effectively as the presented embodiments.

All in all, all imaging methods which are designed for a detection of narrow-band light may take an advantage of the represented embodiments. Among same are for example all applications that work with a laser illumination, like 3D time-of-flight imaging and triangulation sensors. Apart from that, for example spectroscopic applications take an advantage of the more homogenous system response. Some embodiments on the one hand want a general homogenization of sensitivity for all described fields of applications, and on the other hand want systems with high quantities wherein the price of one individual member has to be as low as possible. With the help of the above embodiments, image sensors for narrow-band fields of application may be manufactured which have an outstanding price/precision ratio.

With respect to the above embodiments, it is further noted that it would be easily possible for the optical layer 14a or the corresponding stack 14 to be placed on the substrate backside for a backside illumination.

In other words, above embodiments illustrate photodetectors like for example for monochromatic applications and/or applications with a small spectral bandwidth and methods for manufacturing the same. Photodetectors were described comprising a photosensitive element covered by one or several dielectric layers and which ought to detect light with a small spectral width or monochromatic light. Frequently, the examples were explained with reference to a CMOS photodiode. An image sensor may consist of a plurality of the photosensitive elements. Methods for manufacturing the photosensitive elements were also described.

In particular, among others also a photodetector was described above comprising a substrate, one or several pn transitions on the substrate, one or several dielectric layers like e.g. of a thermal oxide covering the substrate, wherein a thickness of one or several dielectric layers varies within the photodetector. The photodiode ought to be formed so that impinging radiation passes through optical paths having different optical lengths before the same reaches a pn transition. Methods for generating such a photodiode having different internal optical path lengths may be acquired by etching the one or several dielectric cover layers in such a way that fluctuations of the thickness of the one or several dielectric cover layers are acquired.

Again in other words, above explanations describe a photodetector for detecting impinging radiation which comprises a layer thickness and/or refractive index variation which realizes the different internal optical path lengths for the impinging radiation, whereby a fluctuation of the spectral sensitivity of the photodetector is reduced, wherein the photodetector comprises a layer 14a with a discontinues layer thickness profile which comprises areas or zones of different thicknesses within a local photosensitive area 38 of the photodetector 10 contributing to the spectral sensitivity of the photodetector 10. Within the zones the layer thickness is constant. Between the zones the layer thickness profile jumps, i.e. it comprises steps. Only neighboring zones have different layer thicknesses with respect to each other. There may also be zones of equal layer thickness which are not directly adjacent to each other. The area ratio of the sum of the zones located in area 38 having a different layer thickness in pairs with respect to each other but which have a constant layer thickness within the same with respect to (divided by) the overall area of the photosensitive area 38 may, for example, be greater than 80%. To put it in simple words, this means that transitions or steps are very steep. The transitions or steps may, for example, be generated by means of an STI process, i.e. the same may be STI edges. As it was also already mentioned, the average area size $A(i)$ of the parts associated with the individual zones i may be a distribution of the area F of the area 38 in the zones so that $\Sigma A(i)=F$, for example, 25% of F or even below. In absolute terms and not with respect to F, the average surface or area size of $A(i)$ is, for example, 400 nm² or more. The layer thicknesses $d(i)$ associated with the individual zones i may vary with a standard deviation of 10 nm or more. The span of the distribution of the layer thicknesses $d(i)$ is, for example, below 1000 nm, however. Here, the area 38 may be 4 µm² or more with respect to size.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A photodetector for detecting impinging radiation comprising a layer thickness variation realizing different internal optical path lengths for the impinging radiation, wherein the photodetector comprises a photosensitive area contributing to a spectral sensitivity of the photodetector and layer with a discontinuous layer thickness profile which comprises, within the photosensitive area of the photodetector, zones of constant thickness, the constant thickness of which varies among the zones, and between which a layer's thickness step-like changes so that the layer's thickness laterally varies within the local photosensitive area of the photodetector two-dimensionally, whereby a fluctuation of the spectral sensitivity of the photodetector is reduced.

2. The photodetector according to claim 1, wherein the photodetector is a photodiode.

3. The photodetector according to claim 1, comprising a substrate and an optical stack comprising the layer with the discontinuous layer thickness profile above the substrate, wherein in the substrate a photosensitive element of the photodetector is formed.

4. The photodetector according to claim 1, wherein the layer with the discontinuous layer thickness profile is an LOCOS layer or the step-like changes of the layer's thickness are caused by STI edges.

5. The photodetector according to claim 4, further comprising a substrate within which a photosensitive element of the photodetector is formed, and further comprising a planarization surface, wherein the LOCOS layer is arranged between the planarization surface and the substrate.

6. The photodetector according to claim 1, wherein a span of a frequency distribution of the thicknesses of the discontinuous layer thickness profile is greater than 10 nm.

7. The photodetector according to claim 1, wherein a granularity of the zones is finer than a lateral extent of the photosensitive area.

8. An image sensor comprising a plurality of photodetectors for detecting impinging radiation, wherein each photodetector comprises a layer thickness variation realizing different internal optical path lengths for the impinging radiation, and comprises a photosensitive area contributing to a spectral sensitivity of the photodetector and layer with a discontinuous layer thickness profile which comprises, within the photosensitive area of the respective photodetector, zones of constant thickness, the constant thickness of which varies among the zones, and between which a layer's thickness step-like changes so that the layer's thickness laterally varies within the local photosensitive area of the respective photodetector two-dimensionally, whereby a fluctuation of the spectral sensitivity of the respective photodetector is reduced, or comprises a refractive index variation realizing different internal optical path lengths for the impinging radiation, and comprises a photosensitive area contributing to a spectral sensitivity of the respective photodetector and layer with a refractive index profile which comprises, within the photosensitive area of the respective photodetector, zones of constant refractive index, the constant refractive index of which varies among the zones, and between which a layer's refractive index step-like changes so that the layer's refractive index laterally varies within the local photosensitive area of the respective photodetector two-dimensionally, whereby a fluctuation of the spectral sensitivity of the respective photodetector is reduced.

9. The image sensor according to claim 8, comprising a substrate and an optical stack comprising at least one layer above the substrate, wherein for each photodetector in the substrate a photosensitive element is formed, wherein for each photodetector in the optical stack a layer thickness of at least one of the layers comprises several different thicknesses below which the photosensitive element of the respective photodetector is arranged.

10. The photodetector according to claim 1, wherein a span of a frequency distribution of the thicknesses of the discontinuous layer thickness profile is between 10 and 400 nm.

11. A photodetector for detecting impinging radiation comprising a refractive index variation realizing different internal optical path lengths for the impinging radiation, comprises a photosensitive area contributing to a spectral sensitivity of the photodetector and layer with a refractive index profile which comprises, within the photosensitive area of the photodetector 10, zones of constant refractive index, the constant refractive index of which vary among the zones, and between which a layer's refractive index step-like changes so that the layer's refractive index laterally varies within the local photosensitive area of the photodetector two-dimensionally, whereby a fluctuation of the spectral sensitivity of the photodetector is reduced.

12. The photodetector according to claim 11, wherein a span of a frequency distribution of the refractive index profile is greater than 10 nm in terms of optical path length for visible light.

* * * * *